United States Patent
Tan et al.

[11] Patent Number: 6,146,969
[45] Date of Patent: Nov. 14, 2000

[54] PRINTING OPTIMIZED GLOBAL ALIGNMENT MARK AT CONTACT/VIA LAYERS

[75] Inventors: Juan Boon Tan; Soon Ee Neoh; Phuan Yee Hwee, all of Singapore, Singapore

[73] Assignee: Chartered Semiconductor Manufacturing Ltd., Singapore, Singapore

[21] Appl. No.: 09/234,092

[22] Filed: Jan. 19, 1999

[51] Int. Cl.[7] .................................................. H01L 21/76
[52] U.S. Cl. ............................................................ 438/401
[58] Field of Search .................................... 438/401, 666, 438/672–675, 629; 257/797, 620

[56] References Cited

U.S. PATENT DOCUMENTS

| | | | |
|---|---|---|---|
| 5,270,255 | 12/1993 | Wong | 437/194 |
| 5,271,798 | 12/1993 | Sandhu et al. | 156/638 |
| 5,496,777 | 3/1996 | Moriyama | 437/249 |
| 5,525,840 | 6/1996 | Tominaga | 257/797 |
| 5,532,520 | 7/1996 | Haraguchi et al. | 257/797 |
| 5,627,624 | 5/1997 | Yim et al. | 355/53 |
| 5,640,053 | 6/1997 | Caldwell | 257/797 |
| 5,705,320 | 1/1998 | Hsu et al. | 430/313 |
| 5,777,392 | 7/1998 | Fujii | 257/797 |

*Primary Examiner*—Jey Tsai
*Attorney, Agent, or Firm*—George O. Saile; Rosemary L.S. Pike; Larry J. Prescott

[57] ABSTRACT

Scribeline alignment marks and a method of forming the scribeline alignment marks are provided for auxiliary alignment marks on an integrated circuit wafer. The scribeline alignment marks have the same shape and size as the contact holes formed in a layer of dielectric. The scribeline alignment marks are located in alignment rectangles in an X and Y array filling each of the alignment rectangles. Since the alignment marks have the same size and shape as the contact holes the alignment marks will not be overexposed when they are formed using a photolithographic process optimized for the contact holes. When the alignment marks are filled with metal and the wafer is planarized a step height between the top of the metal in the alignment mark hole and the dielectric allows the alignment marks to be used for automatic wafer positioning.

17 Claims, 4 Drawing Sheets

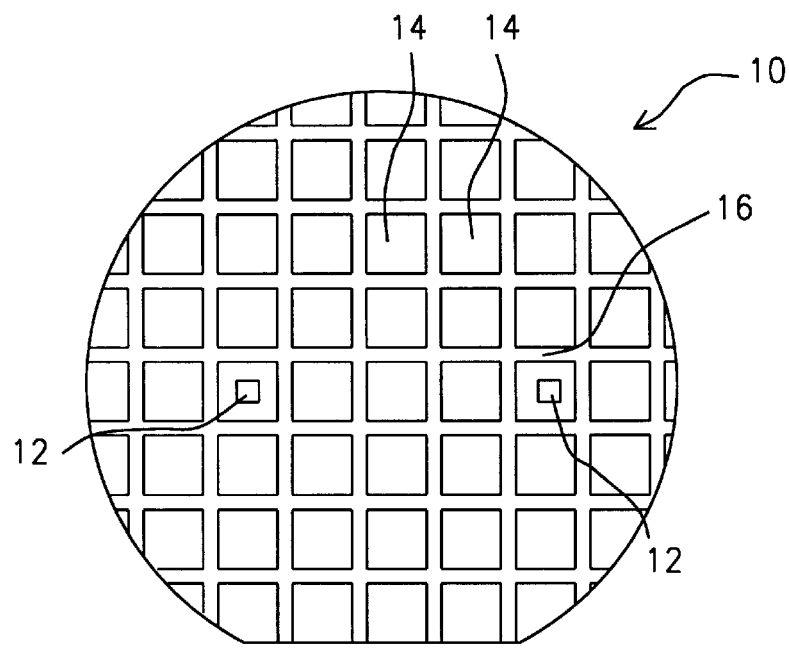
FIG. 1
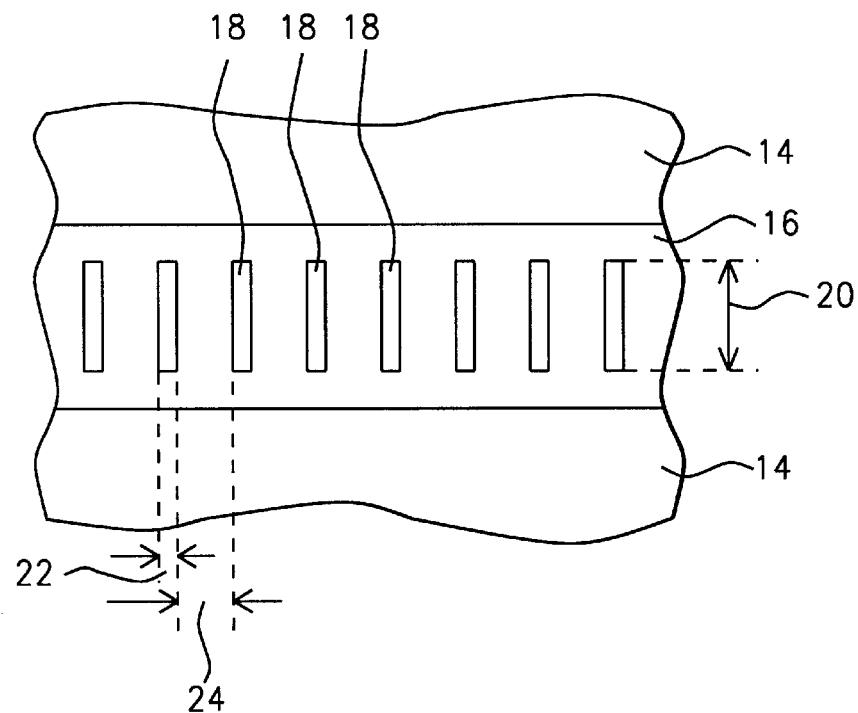
FIG. 2 - Prior Art

PRINTING OPTIMIZED GLOBAL ALIGNMENT MARK AT CONTACT/VIA LAYERS

BACKGROUND OF THE INVENTION

(1) Field of the Invention

This invention relates to the formation of auxiliary alignment marks in the scribline of an integrated circuit wafer. The alignment marks are formed in the same layer of dielectric in which the contact and via holes are formed and are the same size and shape as the contact holes, which prevents overexposure of the alignment marks.

(2) Description of the Related Art

U.S. Pat. No. 5,496,777 to Moriyama describes a method of arranging alignment marks used in different process steps on scribe lines.

U.S. Pat. No. 5,532,520 to Haraguchi et al. describes alignment marks for the X direction alignment of a chip on a semiconductor wafer. The alignment marks comprise recesses and projections which are smaller than the X directional width of a grain on a metal film or the average particle size. The projections may be formed by an insulating layer formed on the semiconductor substrate.

U.S. Pat. No. 5,270,255 to Wong describes a method of metallization of an integrated circuit wafer which provides good step coverage and maintains a useful alignment mark. At least one contact opening to the semiconductor substrate and at least one lithography alignment cross mark opening structure are formed.

U.S. Pat. No. 5,627,624 to Yim et al. describes an integrated circuit test reticle for alignment mark optimization. A test reticle using alignment mark shapes, sizes, and depths is described.

U.S. Pat. No. 5,705,320 to Hsu et al. describes a method of preserving alignment marks after chemical mechanical polishing using a clear out window in the frame area of the contact via reticle.

U.S. Pat. No. 5,640,053 to Caldwell describes an inverse open frame alignment mark.

U.S. Pat. No. 5,271,798 to Sandhu et al. describes a method of selectively removing material from the alignment region of a wafer. Methods of confining etching materials to the alignment region are described.

SUMMARY OF THE INVENTION

Alignment marks are essential in photolithographic processing of semiconductor wafers for aligning the various masks used to pattern different levels of insulators and conductors to the wafer. As various processing steps are completed care must be taken to insure that the alignment marks remain visible so that they can be used for subsequent processing steps. Auxiliary or supplemental alignment marks, which are formed during wafer processing using primary alignment marks for location, are often used to preserve alignment marks during the various processing steps.

FIG. 1 shows a top view of a wafer 10 having a number of device regions 14 formed on the wafer 10. Alignment regions 12 are set aside for the wafers primary alignment marks. The scribeline regions 16 are the regions between device regions 14 of the wafer 10 and are the regions where the wafer will be cut when the device regions are separated into individual chips or die. These scribeline regions are frequently used to locate auxiliary alignment marks so that the auxiliary alignment marks do not consume regions of the wafer reserved for devices.

FIG. 2 shows a top view of a scribeline region 16 between two device regions 14 of the wafer. Scribeline alignment marks are shown in the scribeline region 16 and comprise a number of alignment rectangles 18. In the formation of conventional scribeline alignment marks these alignment rectangles 18 are solid lines forming a line and space pattern. These solid line alignment rectangles 18, formed in the scribeline regions 16, can be formed in materials such as a layer of dielectric, and can be used for automatic alignment of photolithographic exposure tools, such as a wafer stepper. The solid line alignment rectangles 18 in this example have a length 20 of between about 80 and 100 micrometers, a width 22 of between about 6 and 8 micrometers, and are located on a pitch 24 of between about 16 and 19 micrometers.

Problems occur with this type of scribeline alignment marks when used in patterning contact or via holes which are small compared to the width of the alignment rectangles 18. Since the exposure is optimized for the contact or via holes the scribeline alignment rectangles 18 will become overexposed and form poorly defined alignment marks. The quality and accuracy of the alignment marks will be degraded.

It is a principle objective of this invention to provide a method of forming scribeline alignment marks which do not result in overexposure of the alignment mark pattern for small contact or via holes.

It is another principle objective of this invention to provide scribeline alignment marks which are not overexposed when used with patterns for small contact or via holes.

These objectives are achieved by replacing each of the alignment rectangles with a rectangular array of alignment marks, wherein the periphery around each rectangular array of alignment marks has the same size and shape as the alignment rectangles. Each of the alignment marks in the rectangular array of alignment marks has the same size and shape as the contact or via holes. The spacing between adjacent alignment marks is equal to or nearly equal to the spacing between contact or via holes. The width of each rectangular array of alignment marks is equal to the width of the alignment rectangles. The spacing between adjacent rectangular arrays of alignment marks is equal to the spacing between adjacent alignment rectangles.

BRIEF DESCRIPTION OF THE DRAWINGS

FIG. 1 shows a top view of an integrated circuit wafer.

FIG. 2 shows a top view of conventional scribeline alignment marks.

DESCRIPTION OF THE PREFERRED EMBODIMENTS

Figure 3A:
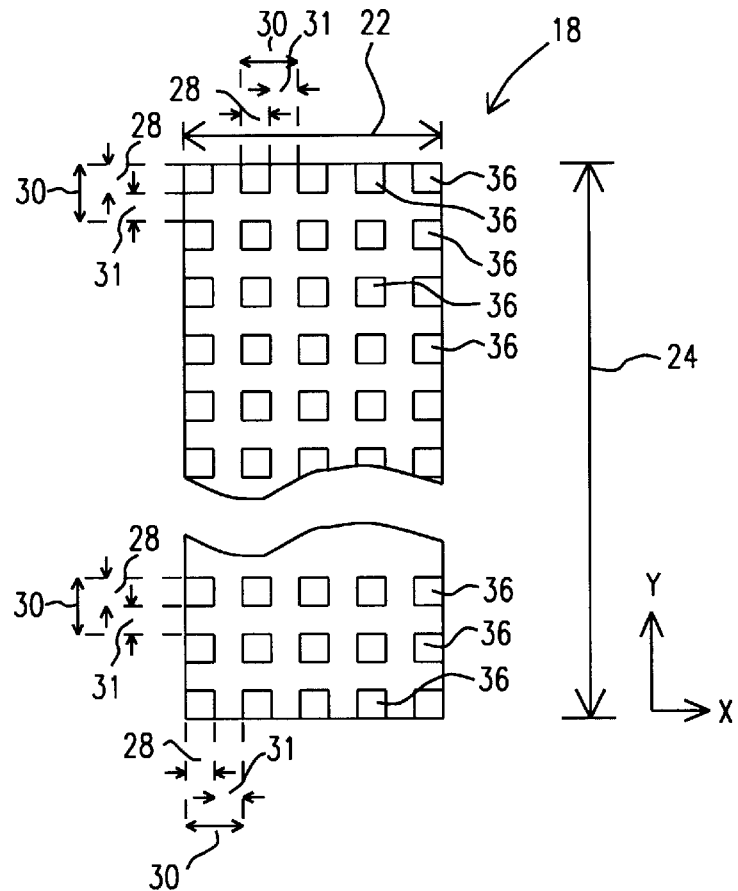
FIG. 3A shows a top view of the scribeline alignment marks of this invention.

Refer now to FIGS. 1, 2, 3A, and 3B for a description of the preferred embodiments of the scribeline alignment marks of this invention. FIG. 1 shows a top view of an integrated circuit wafer 10 having primary alignment regions 12, device regions 14, and scribeline regions 16. The major portion of the wafer is devoted to device regions 14 with some potential device regions, in this example two, being devoted to primary alignment regions 12. The scribeline regions 16 are the regions between the device regions 14, or primary alignment regions 12, where the wafer will be cut to separate the device regions 14 into individual chips or die. The supplementary alignment marks or scribeline alignment marks will be located in the scribeline regions of the wafer and wafer area which could be used for devices is not consumed by the scribeline alignment marks. FIG. 2 shows the location of a number of alignment rectangles 18 in the scribeline region. These alignment rectangles 18 have a length 20, a width 22, and are located on a first pitch 24.

Figure 3B:
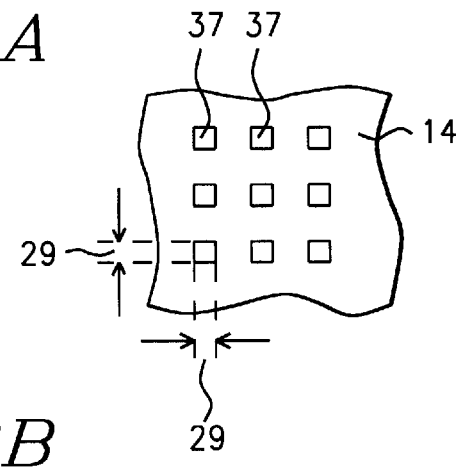
FIG. 3B shows a top view of a part of the device region showing contact holes.

FIG. 3A shows a top view of one of the alignment rectangles 18 showing the detail of each of the alignment rectangles 18. Each alignment rectangle 18 is made up of a rectangular array of square alignment marks 36 each having a width 28. The alignment marks 36 are formed by forming an array of square alignment holes in a layer of dielectric. These alignment holes are then filled with metal forming the alignment marks. The alignment marks 36 have a width 28 and are located on a second pitch 30 in each of two orthogonal directions, X and Y, to form a rectangular array of alignment marks 36. The periphery of the rectangular array of alignment marks has the same size, shape, and location as the alignment rectangles 18. FIG. 3B shows a top view of a part of the device region 17 of the wafer having a number of contact holes 37. The contact holes 37 also comprise holes in the dielectric filled with metal and, in this example, also have the shape of squares. For the alignment marks as well as the contact or via holes the dielectric can be a material such as silicon oxide or the like and the metal can be a material such as tungsten or the like. The scribeline alignment marks 36 have the same width 28 as the width 29 of the contact holes and the pitch 30 is adjusted so that the space 31 between adjacent scribeline alignment marks 36 is the same as the width 28 of the scribeline alignment marks 36. For contact holes having a width of between about 0.50 and 0.70 micrometers the width of the scribeline alignment holes is also between about 0.50 and 0.70 micrometers. For contact holes having a width of between about 0.30 and 0.42 micrometers the width of the scribeline alignment holes is also between about 0.30 and 0.42 micrometers. For contact holes having a width of between about 0.25 and 0.35 micrometers the width of the scribeline alignment holes is also between about 0.25 and 0.35 micrometers. Each of the alignment rectangles has a width of, for example, between about 1.2 and 2.0 micrometers and a length of, for example, between about 70 and 110 micrometers. The alignment rectangles can be located on a pitch of, for example, between about 12.0 and 22.0 micrometers.

Figure 4:
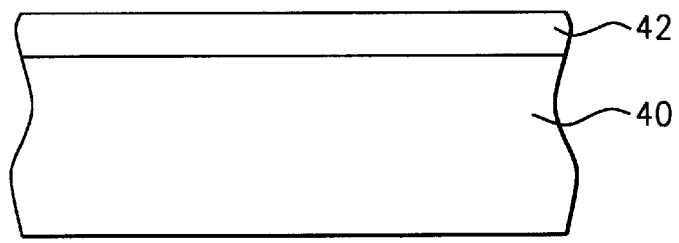
FIG. 4 shows a cross section view of a part of the wafer having a layer of dielectric formed thereon.

Refer now to FIGS. 4–7B for a description of the preferred embodiment of a method of forming the scribeline alignment holes of this invention. FIG. 4 shows a cross section diagram of a part of an integrated circuit wafer 40 having a number of devices formed therein, not shown. A layer of dielectric 42, such as silicon oxide or the like is formed on the wafer. The layer of dielectric has a thickness of between about 6000 and 10,000 Angstroms.

Figure 5A:
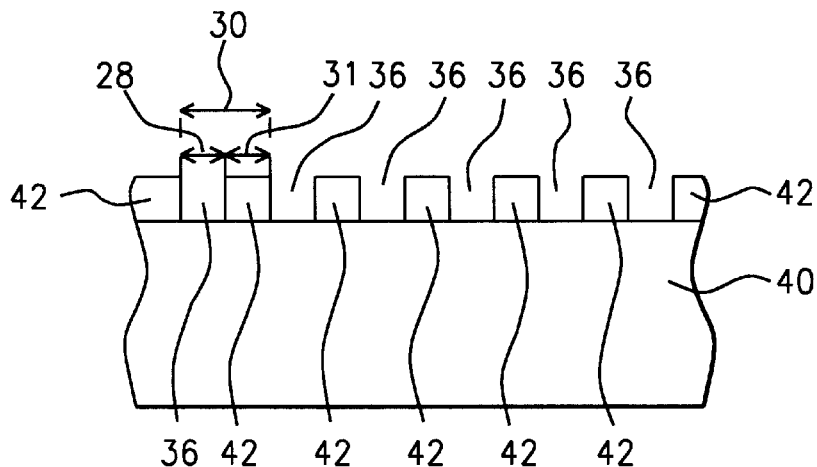
FIG. 5A shows a cross section view of a part of the scribeline region of a wafer with scribeline alignment marks formed in the layer of dielectric.
Figure 5B:
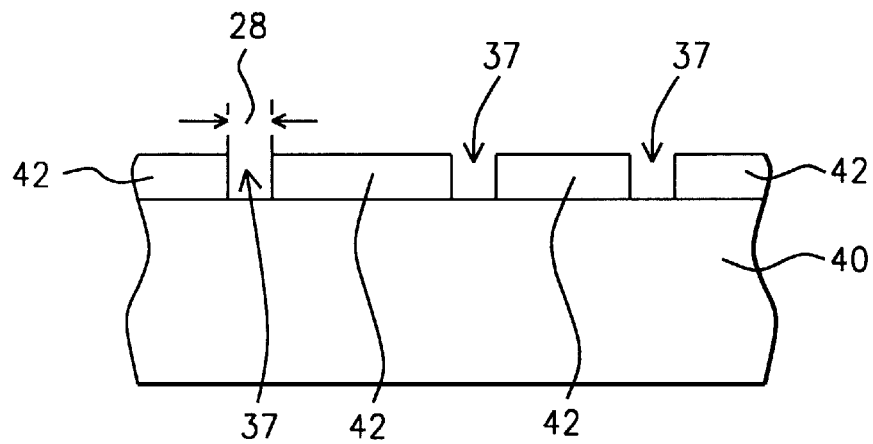
FIG. 5B shows a cross section view of a part of the device region of a wafer with contact holes formed in the layer of dielectric.

As shown in FIG. 5A holes for the scribeline alignment marks 36 are formed in the layer of dielectric 42 using standard photolithographic techniques and etching. The holes for the scribeline alignment marks 36 have a width 28 and are located on a pitch 30 chosen so that the space 31 between adjacent holes for the alignment marks is equal to the width 28 of the alignment mark holes. As shown in FIG. 5B contact holes 37 are formed in the layer of dielectric at appropriate locations in the device region of the wafer. The scribeline alignment holes 36 have the same width 28 as the width 29 of the contact holes. For contact holes having a width of between about 0.50 and 0.70 micrometers the width of the scribeline alignment holes is also between about 0.50 and 0.70 micrometers. For contact holes having a width of between about 0.30 and 0.42 micrometers the width of the scribeline alignment holes is also between about 0.30 and 0.42 micrometers. For contact holes having a width of between about 0.25 and 0.35 micrometers the width of the scribeline alignment holes is also between about 0.25 and 0.35 micrometers.

Figure 6A:
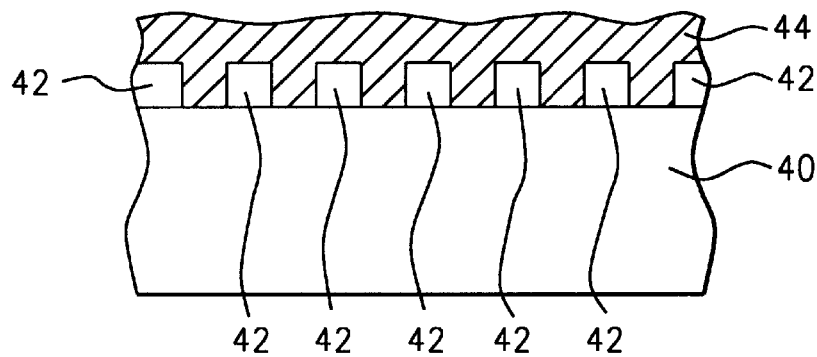
FIG. 6A shows a cross section view of a part of the scribeline region of a wafer with scribeline alignment marks formed in the layer of dielectric and a layer of metal deposited on the wafer filling the scribeline alignment marks.
Figure 6B:
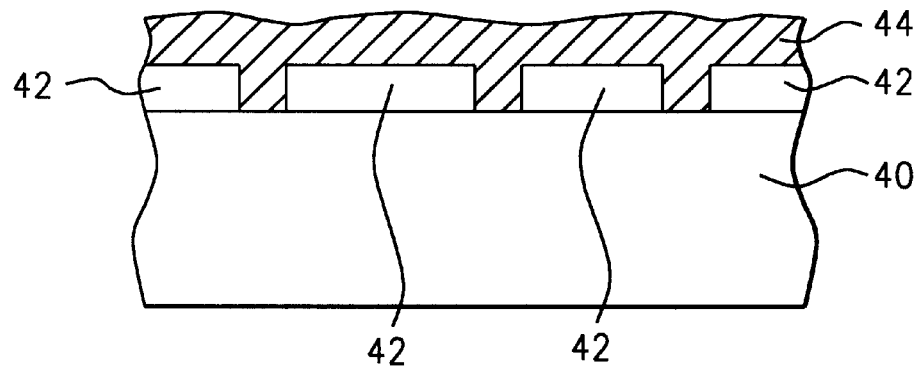
FIG. 6B shows a cross section view of a part of the device region of a wafer with contact holes formed in the layer of dielectric and a layer of metal deposited on the wafer filling the contact holes.
Figure 7A:
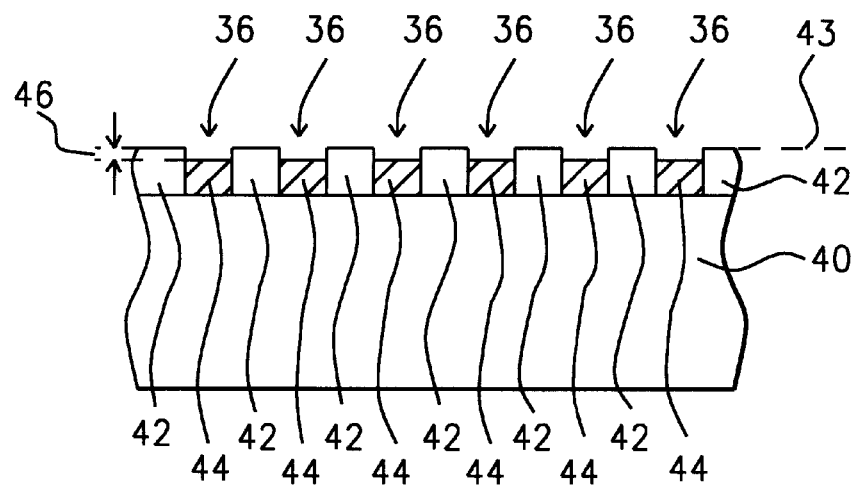
FIG. 7A shows a cross section view of a part of the wafer with scribeline alignment marks formed in the layer of dielectric and metal filling the alignment marks after the wafer has been planarized.
Figure 7B:
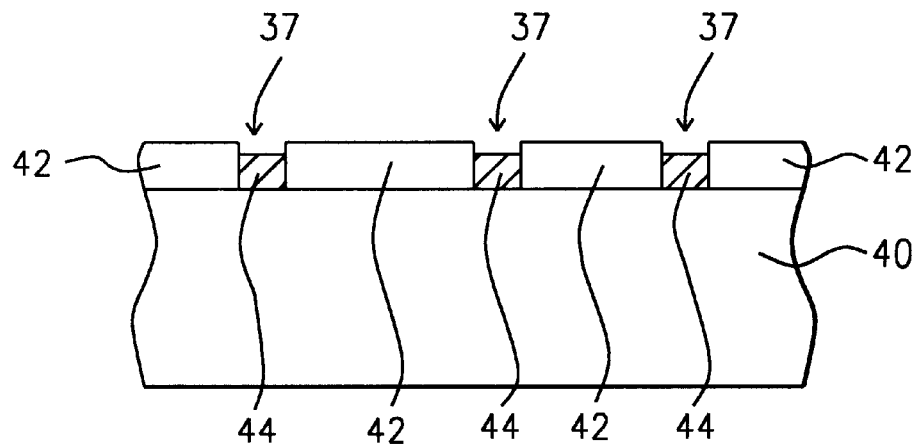
FIG. 7B shows a cross section view of a part of the wafer with contact holes formed in the layer of dielectric and metal filling the contact holes after the wafer has been planarized.

Next, as shown in FIGS. 6A and 6B, a layer of metal 44, such as tungsten or the like, is then deposited on the wafer 40 filling the scribeline alignment holes and the contact holes with metal 44. The layer of metal has a thickness of between about 4000 and 7000 Angstroms. Then, as shown in FIGS. 7A and 7B, the wafer is planarized removing the metal above a plane located a step height 46 below the top surface 43 of the layer of dielectric 42. The planarization is accomplished using methods such as chemical mechanical polishing or back etching using dry etching with $SF_6$ as an etchant. The step height is between about 0.1 and 0.2 micrometers and is sufficiently large so that the scribeline alignment marks can be used for automatic alignment of the wafer in the wafer stepper.

While the invention has been particularly shown and described with reference to the preferred embodiments thereof, it will be understood by those skilled in the art that various changes in form and details may be made without departing from the spirit and scope of the invention.

What is claimed is:

1. A method of forming scribeline alignment marks, comprising:

providing a semiconductor wafer having scribeline regions, wherein said scribeline regions have a number of alignment rectangles;

forming a layer of dielectric having a top surface on said semiconductor wafer;

forming a number of contact holes in said layer of dielectric;

forming a number of alignment holes in said layer of dielectric, wherein said alignment holes are square, said alignment holes are located in said alignment rectangles, said alignment holes in each said alignment rectangle form a rectangular array filling said alignment rectangle, said alignment holes have the same shape and size as said contact holes, in said rectangular array of alignment holes all of said alignment holes are located on a predetermined pitch in a first direction and on said predetermined pitch in a second direction orthogonal to said first direction;

forming a layer of metal on said wafer thereby filling said alignment holes and said contact holes with said metal; and removing that part of said layer of metal above a first plane wherein said first plane is a step height below said top surface of said dielectric.

2. The method of claim 1 wherein said alignment holes have a width of between about 0.50 and 0.70 micrometers.

3. The method of claim 1 wherein said alignment holes have a width of between about 0.30 and 0.42 micrometers.

4. The method of claim 1 wherein said alignment holes have a width of between about 0.25 and 0.35 micrometers.

5. The method of claim 1 wherein said layer of metal is a layer of tungsten having a thickness of greater than 3000 Angstroms.

6. The method of claim 1 wherein said removing that part of said layer of metal above a first plane comprises chemical mechanical polishing.

7. The method of claim 1 wherein said removing that part of said layer of metal above a first plane comprises back etching using dry etching with $SF_6$ as an etchant.

8. The method of claim 1 wherein said layer of metal has a thickness of greater than 3000 Angstroms.

9. The method of claim 1 wherein said step height is between about 0.1 and 0.2 micrometers.

10. The method of claim 1 wherein said semiconductor wafer is a silicon integrated circuit wafer having devices formed therein.

11. Scribeline alignment marks, comprising:

a semiconductor wafer having scribeline regions, wherein said scribeline regions have a number of alignment rectangle;

a layer of di electric having a top surface formed on said semiconductor wafer;

a number of contact holes formed in said layer of dielectric;

a number of alignment holes in said layer of dielectric, wherein said alignment holes are square, said alignment holes are located in said alignment rectangles, said alignment holes in each said alignment rectangle form a rectangular array filling said alignment rectangle, said alignment holes have the same shape and size as said contact holes, in said rectangular array of alignment holes all of said alignment holes are located on a predetermined pitch in a first direction and on said predetermined pitch in a second direction orthogonal to said first direction; and a metal filling that part of said alignment holes below a first plane, wherein said first plane is a step height below said top surface of said dielectric.

12. The scribeline alignment marks of claim 11 wherein said alignment holes have a width of between about 0.50 and 0.70 micrometers.

13. The scribeline alignment marks of claim 11 wherein said alignment holes have a width of between about 0.30 and 0.42 micrometers.

14. The scribeline alignment marks of claim 11 wherein said alignment holes have a width of between about 0.25 and 0.35 micrometers.

15. The scribeline alignment marks of claim 11 wherein said metal is tungsten.

16. The scribeline alignment marks of claim 11 wherein said step height is between about 0.1 and 0.2 micrometers.

17. The scribeline alignment marks of claim 11 wherein said semiconductor wafer is a silicon integrated circuit wafer having devices formed therein.

* * * * *